US012631686B2

(12) United States Patent
Dasamuthu et al.

(10) Patent No.: US 12,631,686 B2
(45) Date of Patent: May 19, 2026

(54) SYSTEM AND METHOD FOR MONITORING HEALTH PARAMETERS OF BATTERY PACK

(71) Applicant: Caterpillar Inc., Peoria (IL)

(72) Inventors: Devaraj Gopalsamy Dasamuthu, Pollachi (IN); Christopher James Green, Peterborough (GB); Adam Jonathan Stubbs, Lincolnshire (GB); Nikhil Badam, Chennai (IN)

(73) Assignee: Caterpillar Inc., Peoria, IL (US)

( * ) Notice: Subject to any disclaimer, the term of this patent is extended or adjusted under 35 U.S.C. 154(b) by 516 days.

(21) Appl. No.: 17/806,506

(22) Filed: Jun. 13, 2022

(65) Prior Publication Data

US 2023/0400523 A1    Dec. 14, 2023

(51) Int. Cl.
| | |
|---|---|
| *G01R 31/3842* | (2019.01) |
| *G01R 31/392* | (2019.01) |
| *H01M 10/42* | (2006.01) |
| *H01M 10/48* | (2006.01) |

(52) U.S. Cl.
CPC ....... *G01R 31/3842* (2019.01); *G01R 31/392* (2019.01); *H01M 10/4257* (2013.01); *H01M 10/482* (2013.01); *H01M 10/486* (2013.01); *H01M 2010/4271* (2013.01); *H01M 2010/4278* (2013.01); *H01M 2220/20* (2013.01)

(58) Field of Classification Search
CPC ............. G01R 31/3842; G01R 31/392; H01M 10/4257; H01M 10/482; H01M 10/486; H01M 2010/4271; H01M 2010/4278; H01M 2220/20; B60L 2240/545; B60L 2240/547; B60L 58/16; B60L 2200/40; B60L 2240/80
See application file for complete search history.

(56) References Cited

U.S. PATENT DOCUMENTS

| | | | |
|---|---|---|---|
| 6,025,695 A | 2/2000 | Friel et al. | |
| 7,774,151 B2 | 8/2010 | Bertness | |
| 9,559,530 B2 | 1/2017 | Lee | |
| 10,440,542 B2 | 10/2019 | Thomas et al. | |

(Continued)

FOREIGN PATENT DOCUMENTS

| | | |
|---|---|---|
| CN | 103522909 A | 1/2014 |
| CN | 112531824 | 3/2021 |

(Continued)

OTHER PUBLICATIONS

European Extended Search Report for Europe Patent Appln. No. 23174687.6, mailed Nov. 6, 2023 (7 pgs).

*Primary Examiner* — Shelby A Turner
*Assistant Examiner* — Yaritza H Perez Bermudez

(57) ABSTRACT

A battery health monitoring (BHM) system for monitoring at least one health parameter of a battery pack. The BHM system includes an internal battery and a clock powered by the internal battery. The clock is configured to track time. The system further includes a control system disposed in communication with the clock for receiving the tracked time as input from the clock. The control system is configured to issue a first trigger signal at a preset wake-up time from within a specified time frame of the tracked time to switch the battery pack from a dormant state to an active state for monitoring the at least one health parameter of the battery pack.

16 Claims, 4 Drawing Sheets

(56)     References Cited

U.S. PATENT DOCUMENTS

| 11,110,815 | B2 * | 9/2021 | Jang | ..................... | B60L 50/16 |
| 11,243,260 | B2 | 2/2022 | Karner et al. | | |
| 11,777,152 | B2 * | 10/2023 | Hess | ..................... | B60L 53/67 |
| | | | | | 429/90 |
| 2018/0198290 | A1 * | 7/2018 | Rohera | ................ | H02J 7/0014 |
| 2019/0176638 | A1 * | 6/2019 | Anderson | ............ | B60W 10/08 |
| 2020/0076014 | A1 | 3/2020 | Garelli et al. | | |
| 2021/0221250 | A1 * | 7/2021 | Hiratsuka | ............... | B60L 53/16 |
| 2022/0077692 | A1 * | 3/2022 | Myers | ................ | H01M 10/425 |
| 2022/0121262 | A1 * | 4/2022 | Wang | ..................... | B60L 58/20 |

FOREIGN PATENT DOCUMENTS

| CN | 112531824 | A | * | 3/2021 | | |
| WO | 2021178196 | | | 9/2021 | | |
| WO | WO-2021238987 | A1 | * | 12/2021 | ............ | H02J 7/0071 |

* cited by examiner

POWER CLOCK TO TRACK TIME

RECEIVE TRACKED TIME AS INPUT FROM CLOCK

ISSUE FIRST TRIGGER SIGNAL AT PRESET WAKE-UP TIME FROM WITHIN SPECIFIED TIME FRAME OF TRACKED TIME TO SWITCH BATTERY PACK FROM DORMANT STATE TO ACTIVE STATE

SYSTEM AND METHOD FOR MONITORING HEALTH PARAMETERS OF BATTERY PACK

TECHNICAL FIELD

The present disclosure relates to a method and a system for monitoring health parameters of a battery pack. More particularly, the present disclosure relates to a method and system for monitoring health parameters of a battery pack when the battery pack is in a dormant state, for example, at a warehouse.

BACKGROUND

Battery packs for mobile and/or stationary machines, such as construction machines, may spend a considerable amount of time outside application area where they are intended to be used. For instance, such battery packs may be stored for a period of time at, for example, a factory, a storage warehouse, a dispatch center, a dealer workshop or another suitable type of storage and/or handling facility. During such periods, health parameters such as cell temperature, voltage level, state of charge of the battery pack may change. Such health parameters may, in turn, be used to determine the usability of the battery pack for a customer requirement besides allowing stakeholders to predict a remaining useful life of the battery pack. If the health parameters are not determined in a timely manner, the stakeholders may not be aware of any deterioration to the battery pack whilst the battery pack may have become unfit for use. Consequently, any subsequent efforts incurred in logistics e.g., in delivery of an unfit battery pack to a remote location and in deployment of the unfit battery pack for the specific requirement may be wasted. Moreover, conventionally known techniques for determining health parameters of battery packs generally require power from the battery pack itself to be supplied continuously to a monitoring unit for monitoring the health parameters of the battery pack resulting in an increased power drain from the battery pack.

United States Publication 2020/0076014 (hereinafter "the '014 reference") relates to a battery module that includes battery cells and a cell monitoring unit (CMU). A cell sense circuit of the CMU measures battery data that includes a cell voltage and a cell temperature of each battery cell. A microprocessor of the CMU determines when the battery module has been dormant for a predetermined dormancy duration during which the battery cells are neither charging nor discharging. Responsive to such dormancy, a Long-Term Data Storage Mode is executed in which, a Radio Frequency (RF) communications circuit paired with the cell sense circuit, collects the battery data at a calibrated interval, and wirelessly transmits the battery data to flash memory of the CMU for storage therein. However, in the Long-Term Data Storage Mode of the '014 reference, the RF communication circuit remains active and paired with other components of the CMU in a low power mode for a duration longer than necessary for the required monitoring to take place thereby leading to continued power drain from the individual battery cells even in the Long-Term Data Storage Mode.

SUMMARY

In one aspect of the present disclosure, a system for monitoring at least one health parameter of a battery pack is disclosed. The system includes an internal battery and a clock powered by the internal battery. The clock is configured to track time. The system further includes a control system disposed in communication with the clock for receiving the tracked time as input from the clock. The control system is configured to issue a first trigger signal at a preset wake-up time from within a specified time frame of the tracked time to switch the battery pack from a dormant state to an active state for monitoring the at least one health parameter of the battery pack.

In another aspect of the present disclosure, a method for monitoring at least one health parameter of a battery pack is disclosed. The method includes powering, by an internal battery, a clock to track time. Further, the method includes receiving, by a control system, the tracked time as input from the clock. The method further includes issuing, by the control system, a first trigger signal at a preset wake-up time from within a specified time frame of the tracked time to switch the battery pack from a dormant state to an active state for monitoring the at least one health parameter of the battery pack.

In yet another aspect of the present disclosure, a battery system having a battery pack and a system for monitoring at least one health parameter of the battery pack is disclosed. The system for monitoring at least one health parameter of the battery pack is coupled to the battery pack and includes an internal battery and a clock powered by the internal battery. The clock is configured to track time. The system further includes a control system disposed in communication with the clock for receiving the tracked time as input from the clock. The control system is configured to issue a first trigger signal at a preset wake-up time from within a specified time frame of the tracked time to switch the battery pack from a dormant state to an active state for monitoring the at least one health parameter of the battery pack.

DETAILED DESCRIPTION

Reference will now be made in detail to specific embodiments or features, examples of which are illustrated in the accompanying drawings. Wherever possible, the same reference numbers will be used throughout the drawings to refer to the same or the like parts.

Figure 1:
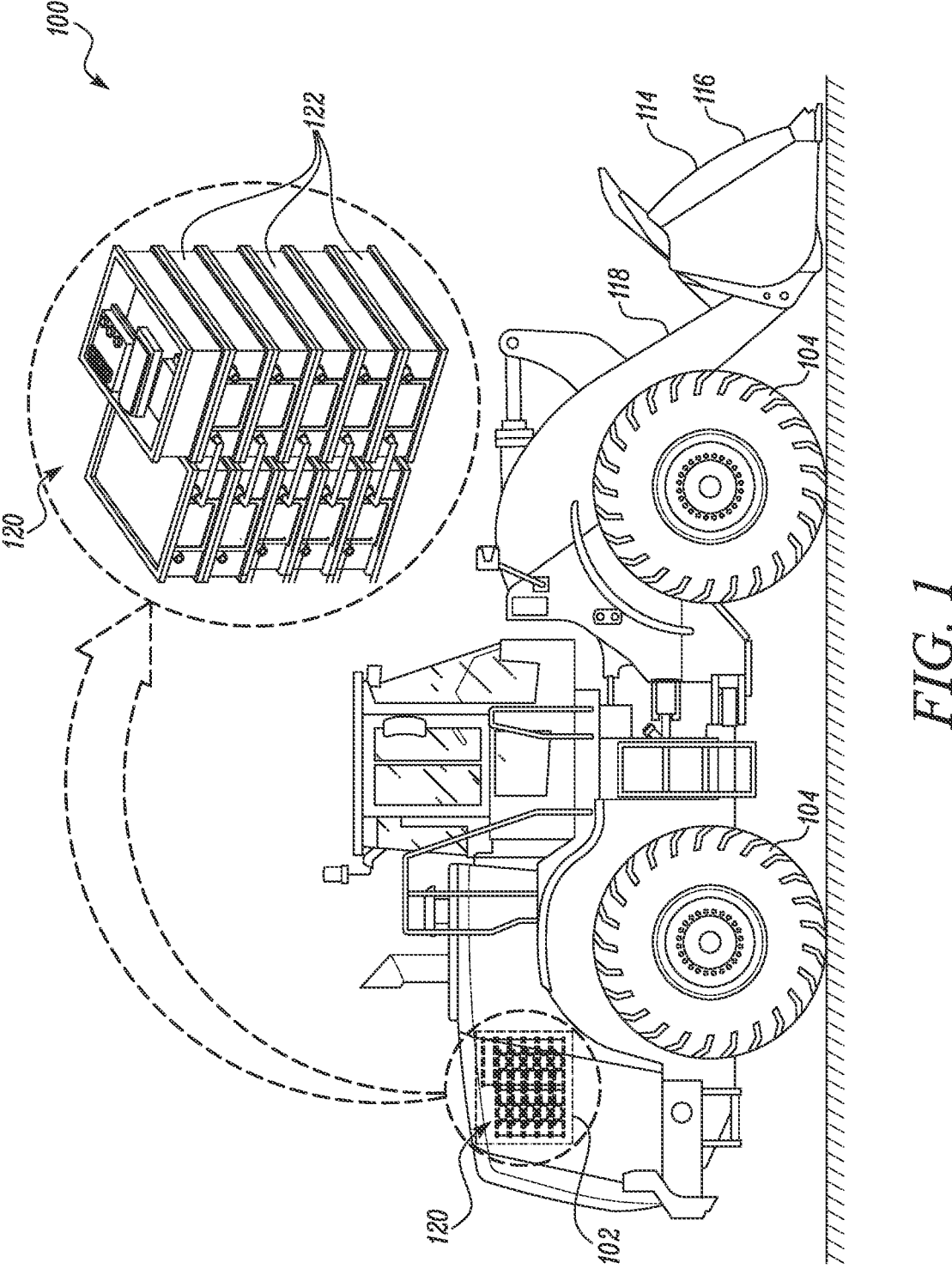
FIG. 1 is a diagrammatic illustration of an exemplary machine having a battery system, in accordance with an embodiment of the present disclosure.

Referring to FIG. 1, an exemplary machine 100 is illustrated. As exemplarily depicted, the machine 100 is embodied as a construction machine, and may include a loader such as a wheel loader. However, it may be contemplated that the machine 100 may be of a type that may be employed to perform operations within an industry such as mining, construction, farming, and transportation. Application of one or more aspects of the present disclosure may be similarly extended to stationary machines, such as, generator sets, as well. Therefore, it will be appreciated that references to the machine 100 are exemplary. Other examples of the machine 100 may include, but is not limited to, an off-highway truck, an articulated truck, a paver, an excavator, a backhoe loader, a skid steer loader, a compactor. As shown in FIG. 1, the machine 100 includes, inter alia, a set of ground engaging members 104 e.g., wheels, an implement 114 e.g., a bucket 116, and a pair of movable lift arms 118 that may be applied to manipulate the implement 114.

The machine 100 may include a prime mover 102 that may provide power to operate the machine 100. The prime mover 102 may include a battery system 120 having a battery pack 122. The battery pack 122 may be applied to supply power to the ground engaging members 104 to move the machine 100 over a ground surface. The battery pack 122 may also be used to supply power to operate the implement 114 and/or perform various other functions of the machine 100. The battery pack 122 may co-operate with one or more additional power sources (not shown) such as an internal combustion engine, an electric generator, a turbine, or any other suitable prime mover by which power may be produced and then supplied to perform one or more of the functions of the machine 100.

Figure 2:
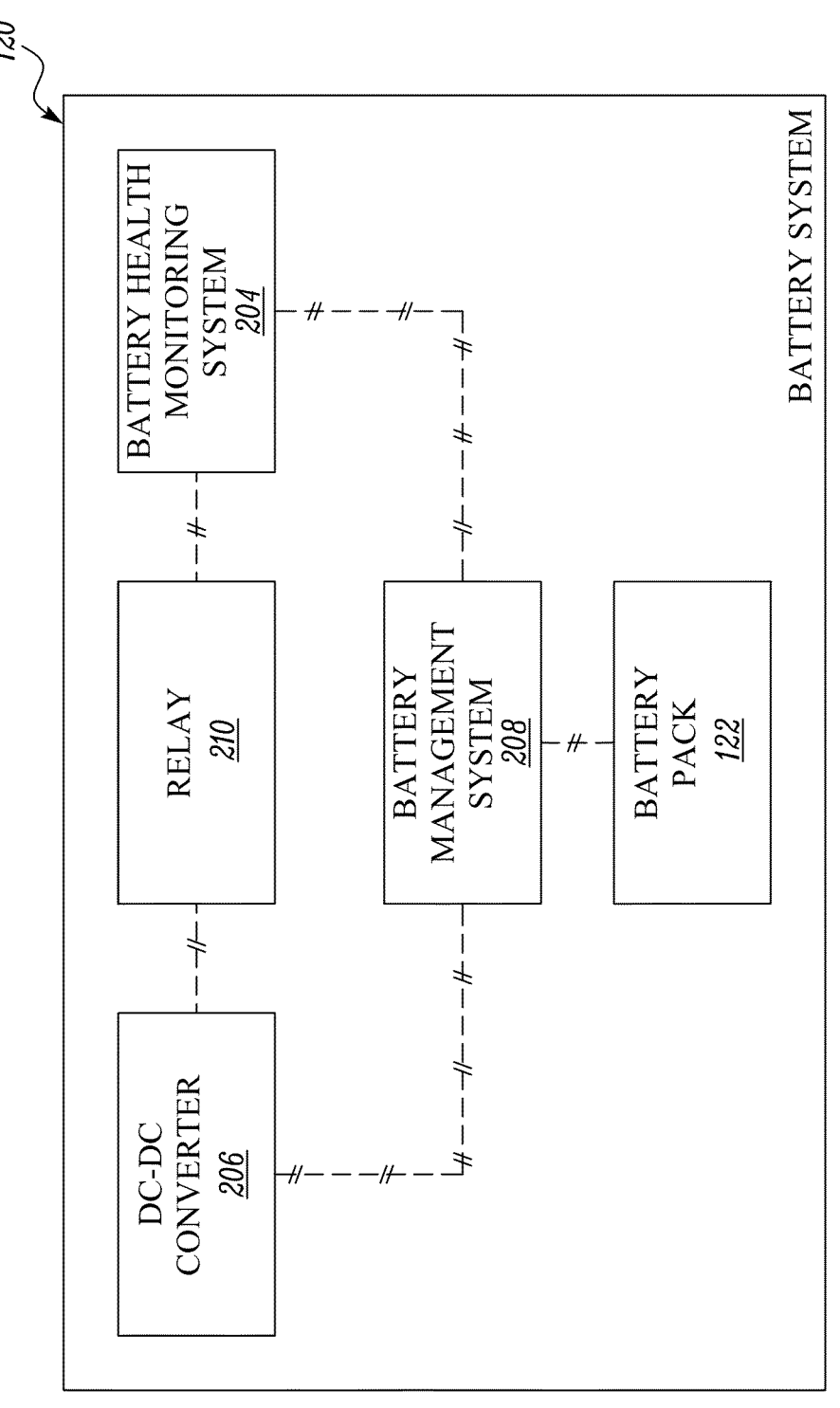
FIG. 2 is a schematic of the battery system having a battery pack and a system for monitoring health parameters of the battery pack, in accordance with an embodiment of the present disclosure.

Referring to FIG. 2, the battery system 120 will now be described. The battery system 120 includes a battery health monitoring (BHM) system 204 to monitor at least one health parameter of the battery pack 122. Further, the battery system 120 may include a DC-DC converter 206, a battery management system 208, and a relay 210. The battery pack 122, the BHM system 204, the DC-DC converter 206, the battery management system 208, and the relay 210 communicate with each other via a local interface (not shown), for example, using wired or wireless communication interfaces. In this disclosure, use of the term "local interface" may be regarded as being inclusive of data and/or power transfer interfaces, for example, buses, CAN links or other wired or wireless connections commonly known to persons skilled in the art. The local interface may have additional elements such as controllers, buffers (caches), drivers, repeaters and receivers, among others, to enable communications. Further, the local interface may include address, control, and/or data connections to enable appropriate communications among various components.

The battery pack 122 may include a plurality of battery cells (not shown). The battery cells may be embodied in the form of, for example, ultra-capacitor cells, super capacitors cells, ultra-batteries, electrochemical cells such as lithium-ion cells, lithium manganese cells, lithium titanate cells, lithium-iron phosphate cells, nickel-cadmium cells, or nickel-metal hydride cells of different sizes. The battery cells may be a rechargeable-type cell or a disposable-type cell. In an embodiment, the battery pack 122 may be further configured to be associated with a plurality of components (not shown) such as, for example, circuit boards, converters, inverters, and controllers. The battery pack 122 and the associated components may be enclosed in a single housing (not shown), and the housing may include one or more additional battery packs (similar to the battery pack 122) based on the power requirements of the machine 100 and its applications. When the battery pack 122 is installed in the machine 100, the battery pack 122 is configured to operate in an active state to operate the machine 100. In the present disclosure, the term "active state" represents a state in which electric power is used or drawn from the battery pack 122 for the performance of one or more of the functions of the machine 100.

For sake of understanding the present disclosure, it may be noted that prior to installation of the battery system 120 in the machine 100, the battery system 120 may form part of an inventory and thus may be located in a warehouse or a storage facility, or the battery system 120 may be in transit, such as on a truck or in a shipping container. In such scenarios, the battery system 120 may be stored, or transported, while being rendered in a dormant state i.e., not in an active state. In the present disclosure, the term "dormant state" represents a state during which electric power is not used or drawn from the battery pack 122 such that electric power may be conserved within the battery pack 122.

During such periods of non-use of the battery pack 122, one or more health parameters of the battery cells of the battery pack 122 may change, and therefore, such health parameters may be periodically measured and/or monitored. The health parameters may include one or more of highest cell temperature of each battery cell of the battery pack 122, lowest cell temperature of each battery cell of the battery pack 122, voltage level of each battery cell of the battery pack 122, current drawn from each battery cell of the battery pack 122, energy throughput of the battery pack 122, state of charge of each battery cell of the battery pack 122, state of health of each battery cell of the battery pack 122, and high voltage disconnect forewarning.

The battery management system 208 may be configured to periodically measure and/or retrieve the health parameters of the battery pack 122. The battery management system 208 may include one or more sensors, such as, a voltage sensor, a current sensor, and a temperature sensor, to measure the health parameters of the battery pack 122. For sake of brevity, details pertaining to operations required in measuring the health parameters of the battery pack 122 and a functioning of the battery management system 208 have been omitted as such operations are known to persons having ordinary skill in the art.

As shown in the illustrated embodiment of FIG. 2, the battery management system 208 is coupled to the DC-DC converter 206. In this embodiment of the present disclosure, the terms "DC-DC converter" may be regarded as an electrical component that has direct current as input and output and converts this direct current from either a high voltage to low voltage or vice-versa. The DC-DC converter 206 may be configured to provide output power from the battery pack 122 to the battery management system 208 in response to one or more trigger signals received from the BHM system 204. The DC-DC converter 206 may be configured to provide the output power from the battery pack 122 to one or more components of the BHM system 204 in response to the one or more trigger signals received from the BHM system 204, as described in the forthcoming disclosure. The DC-DC converter 206 may be coupled to the BHM system 204 via the relay 210 to receive the one or more trigger signals.

Figure 3:
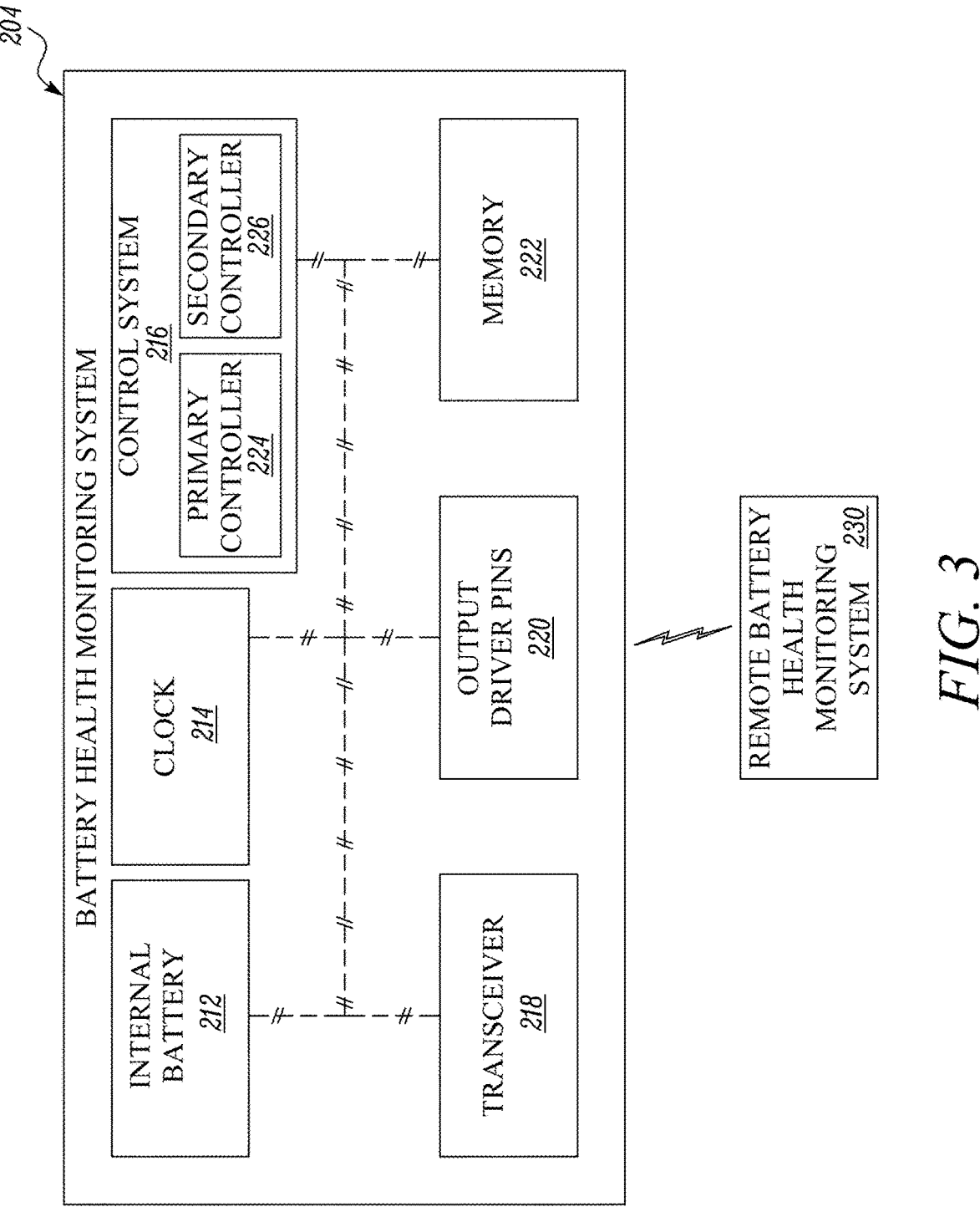
FIG. 3 is a schematic of the system for monitoring health parameters of the battery pack, in accordance with an embodiment of the present disclosure.

The BHM system 204 is configured to monitor at least one health parameter of the battery pack 122 during periods of non-use of the battery pack 122. In an embodiment, the BHM system 204 may be embodied as a telematics electronic control unit. As shown in FIG. 3, the BHM system 204 includes an internal battery 212, a clock 214, a control system 216, a transceiver 218, the output driver pins 220, and the memory 222. The control system 216 may include a primary controller 224 and a secondary controller 226. The internal battery 212, the clock 214, the control system 216, the transceiver 218, the output driver pins 220, and the memory 222 cooperate with one another to enable operations of the BHM system 204 that are consistent with the present disclosure. These components may communicate with each other via a local interface (not shown), for example, using wired or wireless communication interfaces.

The internal battery 212 may be configured to power one or more components such as the clock 214 and the control system 216 of the BHM system 204. The internal battery 212 may include one or more of a solar panel, a fuel cell, an inductive RF energy harvesting circuit or be embodied in other forms, or types, of DC power sources commonly known to persons skilled in the art. One or more features and/or configurations of the internal battery 212 may be similar to that of the battery pack 122. In accordance with the present disclosure, the internal battery 212 may be configured to operate in two different power modes, for example, a low power mode and a full power mode, with a power output in the low power mode being substantially lower when compared to a power output in the full power mode, for e.g., ratio of power output during the low power mode and the high power mode may lie in the range of 0.1:10 to 1:10. The internal battery 212 may be configured to power the clock 214 and the secondary controller 226 of the control system 216 in the low power mode, and each of the clock 214, the secondary controller 226, and the primary controller 224 of the control system 216 in the full power mode. In an embodiment, the internal battery 212 may be charged by a power source, such as, the battery pack 122.

The clock 214 is powered by the internal battery 212 and is configured to track time. Further, the clock 214 is configured to track a preset wake-up time at which the primary controller 224 of the control system 216 of the BHM system 204 is configured to switch the battery pack 122 from the dormant state to the active state to monitor the health parameters of the battery pack 122. The preset wake-up time may correspond to a time from within a specified time frame of the tracked time. In accordance with various embodiments, the wake-up time may correspond to multiple periodic wake-up times such that multiple intervals may be defined during which the health parameters may be monitored.

The secondary controller 226 of the control system 216 is disposed in communication with the clock 214 and may receive the tracked time as input from the clock 214. In response to the input, the secondary controller 226 of the control system 216 is configured to activate the primary controller 224 of the control system 216 at the specified time frame of the tracked time.

The primary controller 224 of the control system 216 may retrieve a set of instruction from a memory 222 and run the set of instructions to generate one or more trigger signals (e.g., a first trigger signal) from within the specified time frame of the tracked time. The primary controller 224 of the control system 216 may also generate a second trigger signal. The second trigger signal may be generated either from within another specified time frame of the tracked time or after lapse of a predetermined duration from the generation of the first trigger signal.

Further, the set of instructions may be run by the primary controller 224 of the control system 216 to deliver the trigger signals to the DC-DC converter 206 such that the primary controller 224 of the control system 216 may enable switching of the battery pack 122 between the dormant state and the active state (e.g., from the dormant state to the active state based on the first trigger signal and from the active state to the dormant state based on the second trigger signal). When the first trigger signal is delivered to the DC-DC converter, the battery management system 208 can be activated to retrieve the health parameters from the battery pack 122. The transceiver 218 is further configured to transmit the health parameters of the battery pack 122 to a remote battery health monitoring station 230 such that the health parameters can be monitored.

The memory 222 may include random access memory (RAM) and/or read only memory (ROM). Further, the memory 222 may incorporate electronic, magnetic, optical, and/or other types of storage media. The control system 216 may include one or more processors, controllers, microprocessors, microcontrollers, digital signal processors (DSPs), state machines, logic circuitry, or other devices known to persons skilled in the art to process information or signals based on operational or programming instructions. The control system 216 may be implemented using one or more controller technologies, such as Application Specific Integrated Circuit (ASIC), Reduced Instruction Set Computing (RISC) technology, Complex Instruction Set Computing (CISC) technology or other similar technology known to persons skilled in the art.

INDUSTRIAL APPLICABILITY

Figure 4:
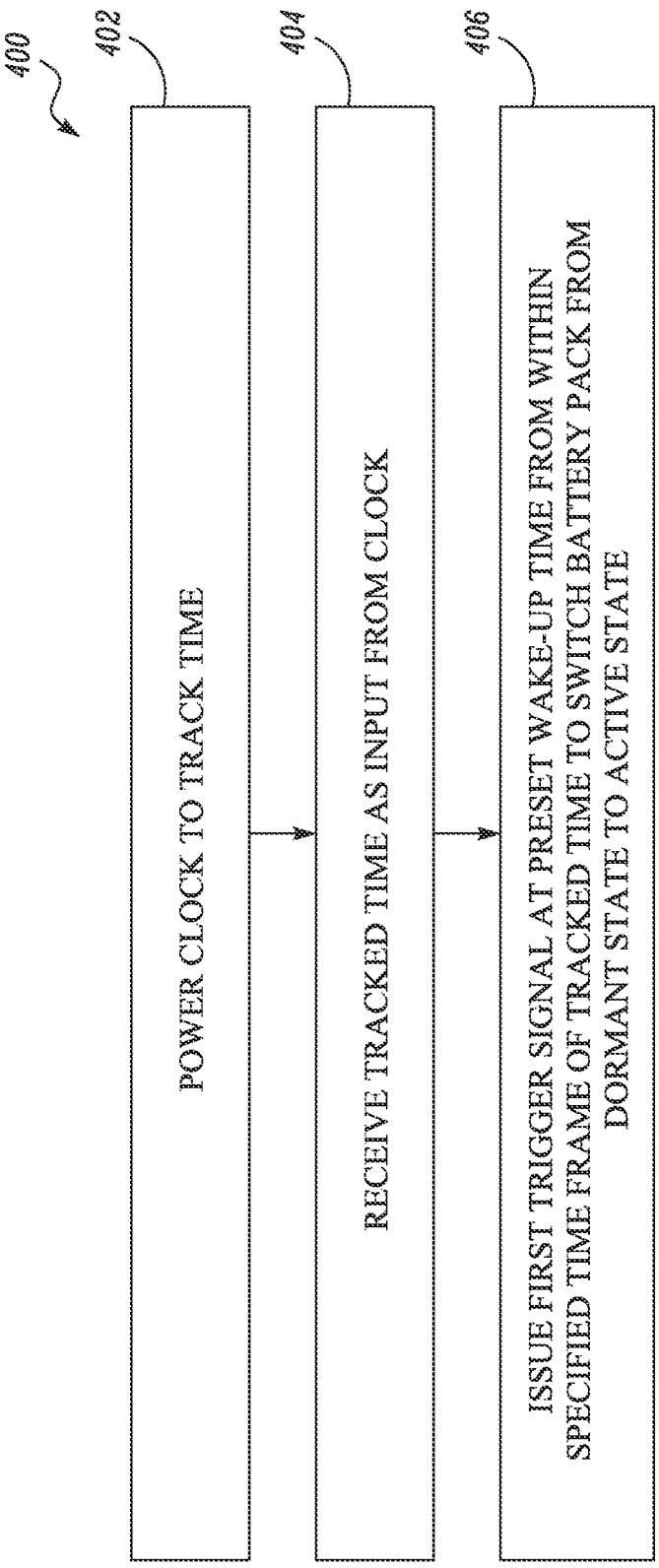
FIG. 4 is a flowchart illustrating steps of a method for monitoring health parameters of the battery pack, in accordance with an embodiment of the present disclosure.

FIG. 4 shows a method 400 for monitoring at least one health parameter of the battery pack 122. During the dormant state of the battery pack 122, the components of the battery system 120, except the BHM system 204, are configured to be inactive. At step 402, the internal battery 212 of the BHM system 204 operates in the low power mode to power the clock 214 to track time. The internal battery 212 also powers the secondary controller 226 of the control system 216 in the low power mode and the secondary controller 226 of the control system 216 receives the tracked time as input from the clock 214 at step 404. At step 406, as the clock 214 reaches the preset wake-up time, the secondary controller 226 activates the primary controller 224, and the primary controller 224 of the control system 216 in turn issues a first trigger signal at the preset wake-up time (i.e., from within a specified time frame of the tracked time). In accordance with various embodiments, the control system 216 (e.g., the primary controller 224 of the control system 216) issues the first trigger signal to switch the battery pack 122 from the dormant state to the active state for monitoring the health parameters of the battery pack 122 at the wake-up time.

In further detail, the primary controller 224 of the control system 216 delivers the first trigger signal to the DC-DC converter 206 via the relay 210 at the wake-up time. The DC-DC converter 206 wakes up upon receiving the first trigger signal and provides output power (e.g., rectified or suitably converted output power) from the battery pack 122 to the battery management system 208 to wake up the battery management system 208 such that the battery management system 208 may retrieve the health parameters of the battery pack 122. The DC-DC converter 206 may also provide output power from the battery pack 122 to the transceiver 218 of the BHM system 204 such that the control system 216 (e.g., the primary controller 224 of the control system 216) may control the transceiver 218 to transmit the health parameters of the battery pack 122 to the remote battery health monitoring station 230.

In an embodiment, the output power is a 24 Volts control signal. The battery management system 208, upon receiving said control signal, switches the state of the battery cells of the battery pack 122 from the dormant state to the active state and retrieves the health parameters of the battery pack 122. The battery management system 208 provides the health parameters to the BHM system 204.

In an embodiment, the primary controller 224 of the control system 216 is configured to switch the internal battery 212 from the low power mode to the full power mode at the wake-up time. To this end, the clock 214 may be configured to initiate the generation of a trigger signal (e.g., the first trigger signal) from the primary controller 224 of the control system 216 based on which a state of the internal battery 212 may be changed from the low power mode to the full power mode. The internal battery 212, upon receiving the trigger signal from the primary controller 224 of the control system 216, switches to operate in the full power mode and provides power to the primary controller 224 of the control system 216 such that the primary controller 224 of the control system 216 controls the monitoring of the health parameters of the battery pack 122.

In an embodiment, the primary controller 224 of the control system 216 generates a second trigger signal to switch the battery pack 122 from the active state to the dormant state at the end of the specified time frame of the tracked time. In an embodiment, the duration of the specified time frame may be predefined. For example, the duration of the specified time frame may be between the range of 1 second to 5 minutes. In this case, the start time of the time frame could be the preset wake-up time and the end time of the time frame could be another set time, for example, within 5 minutes of the preset wake-up time or at 5 minutes from the preset wake-up time. For example, when the start time of the time frame is 12:00:00 and the duration of the time frame is 5 minutes, the stop time will be 12:05:00. Said values for the duration of the specified time frame have been provided for illustrative purpose and can include any values in actual practice and application.

When the primary controller 224 of the control system 216 is able to transmit the health parameters of the battery pack 122 to the remote battery health monitoring station 230 well before the end of the specified time frame, e.g., within 2 minutes as opposed to the 5 minutes duration of the time frame, the primary controller 224 of the control system 216 may be configured to generate the second trigger signal in response to or after (e.g., immediately after) transmitting the health parameter to the remote battery health monitoring station 230. The primary controller 224 of the control system 216 provides the second trigger signal to the battery management system 208 to switch the battery management system 208 back to the inactive state. The output power provided through the DC-DC converter 206 is also disconnected or discontinued when the battery management system 208 switches to the inactive state. The battery management system 208 thus in turn switches the battery pack 122 from the active state to the dormant state and remains in the inactive state until the next wake-up time. At this stage, the internal battery 212 is also switched or returned to the low power mode i.e., powered down to power the clock 214 and the secondary controller 226 of the control system 216.

The generation of the second trigger signal before the end time of the specified time frame causes the components of the battery system 120 (except the BHM system 204) to be in the inactive state, thus resulting in additional conservation of the power of the battery pack 122. In accordance with various embodiments, the wake-up time may correspond to multiple periodic wake-up times such that multiple intervals may be defined during which the health parameters may be monitored. For instance, the wake-up time may occur once every day or once every 19-hour period. Said values have been provided for illustrative purpose and can include any values in actual practice and application.

Implementation and use of the method 400 and the BHM system 204 of the present disclosure enable remote monitoring of the health parameters of the battery pack 122 while conserving the power of the battery pack 122. Due to the presence of the internal battery 212 in the BHM system 204, the power required to track the wake-up time and provide control signal or output power to the other components of the battery system 120 is obtained directly from the internal battery 212. Once the control signal is obtained, only then the battery pack 122 is switched from the dormant state to the active state for a predefined limited period of time for monitoring the health parameters of the battery pack 122. This eliminates the need to draw power continuously from the battery pack 122 of the battery system 120 to power the other components of the battery system 120 for monitoring purposes.

Wherever the context so applies in the present disclosure, the term "immediately" refers to an immediate switching of the battery pack 122 to the dormant state such that its power can be conserved. While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A battery health monitoring (BHM) system for monitoring at least one health parameter of a battery pack, the BHM system comprising:

an internal battery;

a clock powered by the internal battery and configured to track time;

a DC-DC converter coupled to the BHM system, the DC-DC converter configured to:

transition to an active state upon the DC-DC converter receiving a first trigger signal from the BHM system, the DC-DC converter being operable to provide output power when in the active state; and transition to an inactive state upon receiving a second trigger from the BHM system, the DC-DC converter being configured to discontinue providing the output power when in the inactive state; and a control system powered by the internal battery and disposed in communication with the clock for receiving tracked time as input from the clock, wherein the control system includes a primary controller to issue the first trigger signal and a secondary controller to receive the tracked time from the clock and to activate the primary controller at a specified time frame of the tracked time, wherein the clock is configured to initiate trigger signal generation from the primary controller of the control system to switch the internal battery from a low power mode to a full power mode, and wherein the internal battery is configured to power only the clock and the secondary controller of the control system in the low power mode, and each of the clock the secondary controller, and the primary controller of the control system in the full power mode, the control system configured to:

issue the first trigger signal at a preset wake-up time from within a specified time frame of the tracked time to switch the battery pack from a dormant state to an active state for monitoring the at least one health parameter of the battery pack.

2. The BHM system of claim 1, wherein the control system is configured to obtain the at least one health parameter of the battery pack in the active state and generate the second trigger signal to switch the battery pack from the active state to the dormant state at an end of the specified time frame of the tracked time.

3. The BHM system of claim 1, wherein a duration of the specified time frame is between a range of 2 minutes to 5 minutes.

4. The BHM system of claim 1, further comprising a transceiver configured to transmit the at least one health parameter of the battery pack in the active state to a remote battery health monitoring station.

5. The BHM system of claim 4, wherein the control system is configured to control the transceiver for transmission of the at least one health parameter of the battery pack in the active state and generate the second trigger signal in response to transmitting the at least one health parameter to switch the battery pack from the active state to the dormant state.

6. The BHM system of claim 1, wherein the primary controller of the control system is configured to switch the internal battery from the low power mode to the full power mode at the preset wake-up time.

7. The BHM system of claim 1, wherein the at least one health parameter of the battery pack includes one or more of highest cell temperature of each battery cell of the battery pack, lowest cell temperature of each battery cell of the battery pack, voltage level, current, energy throughput, state of charge, state of health, and high voltage disconnect forewarning.

8. A method for monitoring at least one health parameter of a battery pack, the method comprising:

powering, by an internal battery, a clock to track time;

receiving, by a control system powered by the internal battery, tracked time as input from the clock; and issuing, by the control system, a first trigger signal at a preset wake-up time from within a specified time frame of the tracked time, the first trigger signal configured to:

switch the battery pack from a dormant state to an active state for monitoring the at least one health parameter of the battery pack; and transition a DC-DC converter to an active state, the DC-DC converter being operable to provide output power in the active state;

issuing, by the control system, a second trigger signal to transition the DC-DC converter to an inactive state, the DC-DC converter being configured to discontinue providing the output power when in the inactive state; and transmitting, by a transceiver, the at least one health parameter of the battery pack in the active state to a remote battery health monitoring station, wherein issuing the first trigger signal includes issuing, by a primary controller of the control system, the first trigger signal and wherein receiving the tracked time includes receiving, by a secondary controller of the control system, the tracked time and activation of the primary controller at the specified time frame of the tracked time, and wherein the internal battery is configured to power only the clock and the secondary controller of the control system in a low power mode and configured to power each of the clock, the secondary controller and the primary controller of the control system in a full power mode.

9. The method of claim 8 further comprising:

obtaining, by the control system, the at least one health parameter of the battery pack in the active state; and generating, by the control system, the second trigger signal to switch the battery pack from the active state to the dormant state at an end of the specified time frame of the tracked time.

10. The method of claim 8, further comprising:

controlling, by the control system, the transceiver for transmission of the at least one health parameter of the battery pack in the active state; and generating, by the control system, the second trigger signal in response to transmitting the at least one health parameter to switch the battery pack from the active state to the dormant state.

11. The method of claim 8 further comprising:

switching, by the primary controller of the control system, the internal battery from the low power mode to the full power mode at the preset wake-up time.

12. The method of claim 8, wherein the at least one health parameter of the battery pack includes one or more of highest cell temperature of each battery cell of the battery pack, lowest cell temperature of each battery cell of the battery pack, voltage level, current, energy throughput, state of charge, state of health, and high voltage disconnect forewarning.

13. A battery system comprising:

a battery pack; and a battery health monitoring (BHM) system coupled to the battery pack for monitoring at least one health parameter of the battery pack, the BHM system including:

an internal battery;

a clock powered by the internal battery and configured to track time;

a DC-DC converter coupled to the BHM system and a battery management system, wherein the DC-DC converter is configured to:

transition to an active state upon the DC-DC converter receiving a first trigger signal from the BHM system, the DC-DC converter being operable to provide output power when in the active state; and transition to an inactive state upon receiving a second trigger from the BHM system, the DC-DC converter being configured to discontinue providing the output power when in the inactive state; and a control system powered by the internal battery and disposed in communication with the clock for receiving tracked time as input from the clock, the control system configured to issue the first trigger signal at a preset wakeup time from within a specified time frame of the tracked time to switch the battery pack from a dormant state to an active state for monitoring the at least one health parameter of the battery pack, wherein the control system includes a primary controller to issue the first trigger signal and a secondary controller to receive the tracked time from the clock and to activate the primary controller at the specified time frame of the tracked time, wherein the clock is configured to initiate trigger signal generation from the primary controller of the control system to switch the internal battery from a low power mode to a full power mode, and wherein the internal battery is configured to power only the clock and the secondary controller of the control system in the low power mode, and each of the clock the secondary controller, and the primary controller of the control system in the full power mode.

14. The battery system of claim 13, wherein the control system is configured to obtain the at least one health parameter of the battery pack in the active state and generate the second trigger signal to switch the battery pack from the active state to the dormant state at an end of the specified time frame of the tracked time.

15. The battery system of claim 13, wherein the DC-DC converter is configured to receive the first trigger signal from the control system and provide output power from the battery pack to the battery management system to retrieve the at least one health parameter from the battery pack.

16. The battery system of claim 13 further comprising: a transceiver configured to transmit the at least one health parameter of the battery pack in the active state to a remote battery health monitoring station.

\* \* \* \* \*